(12) United States Patent
Burgess et al.

(10) Patent No.: US 7,838,178 B2
(45) Date of Patent: Nov. 23, 2010

(54) MASKS FOR MICROLITHOGRAPHY AND METHODS OF MAKING AND USING SUCH MASKS

(75) Inventors: Byron N. Burgess, Allen, TX (US); William A. Stanton, Boise, ID (US); Zhong Shi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 494 days.

(21) Appl. No.: 11/838,130

(22) Filed: Aug. 13, 2007

(65) Prior Publication Data

US 2009/0047583 A1    Feb. 19, 2009

(51) Int. Cl.
*G03F 1/00*    (2006.01)
(52) U.S. Cl. .......................................................... 430/5
(58) Field of Classification Search ....................... 430/5
See application file for complete search history.

(56) References Cited

U.S. PATENT DOCUMENTS

| | | | |
|---|---|---|---|
| 4,988,188 A | 1/1991 | Ohta | |
| 5,142,132 A | 8/1992 | MacDonald et al. | |
| 5,194,893 A | 3/1993 | Nishi | |
| 5,300,971 A | 4/1994 | Kudo | |
| 5,436,464 A | 7/1995 | Hayano et al. | |
| 5,460,908 A | 10/1995 | Reinberg | |
| 5,602,620 A | 2/1997 | Miyazaki et al. | |
| 5,631,721 A | 5/1997 | Stanton et al. | |
| 5,661,546 A | 8/1997 | Taniguchi | |
| 5,684,566 A | 11/1997 | Stanton | |
| 5,721,608 A | 2/1998 | Taniguchi | |
| 5,796,467 A | 8/1998 | Suzuki | |
| 5,883,700 A | 3/1999 | Someya | |

(Continued)

FOREIGN PATENT DOCUMENTS

EP    0462560    12/1991

(Continued)

OTHER PUBLICATIONS

Boulder Nonlinear Systems, "256×256 Multi-level/Analog Liquid Crystal Spatial Light Modulator," 2 pages, <http://www.bnonlinear.com/papers/256SLM.pdf>.

(Continued)

*Primary Examiner*—Mark F Huff
*Assistant Examiner*—Jonathan Jelsma
(74) *Attorney, Agent, or Firm*—Perkins Coie LLP

(57) ABSTRACT

Masks for microlithography apparatus, methods for making such masks, and methods for exposing photosensitive materials to form arrays of microfeatures on semiconductor wafers using such masks. In one embodiment, a method of making a mask comprises forming a mask layer on a substrate and identifying a first opening in the mask layer corresponding to a first feature site at which an intensity of the radiation at a focal zone is less than the intensity of the radiation at the focal zone for a second feature site corresponding to a second opening in the mask. The second opening is adjacent or at least proximate the first opening. The method can further include forming a first surface at the first opening and a second surface at the second opening such that radiation passing through the second opening constructively interferes with radiation passing through the first opening at the focal zone.

19 Claims, 2 Drawing Sheets

U.S. PATENT DOCUMENTS

| | | | |
|---|---|---|---|
| 5,897,975 A * | 4/1999 | Ahn et al. | 430/5 |
| 5,907,392 A | 5/1999 | Makinouchi | |
| 5,969,800 A | 10/1999 | Makinouchi | |
| 6,084,244 A | 7/2000 | Saiki et al. | |
| 6,188,464 B1 | 2/2001 | Makinouchi | |
| 6,215,578 B1 | 4/2001 | Lin | |
| 6,251,550 B1 | 6/2001 | Ishikawa | |
| 6,259,513 B1 | 7/2001 | Gallatin et al. | |
| 6,285,440 B1 | 9/2001 | Takahashi | |
| 6,285,488 B1 | 9/2001 | Sandstrom | |
| 6,291,110 B1 | 9/2001 | Cooper et al. | |
| 6,379,867 B1 | 4/2002 | Mei et al. | |
| 6,392,740 B1 | 5/2002 | Shiraishi et al. | |
| 6,498,685 B1 | 12/2002 | Johnson | |
| 6,501,532 B2 | 12/2002 | Suzuki | |
| 6,504,644 B1 | 1/2003 | Sandstrom et al. | |
| 6,549,266 B1 | 4/2003 | Taniguchi | |
| 6,577,379 B1 | 6/2003 | Boettiger et al. | |
| 6,586,160 B2 | 7/2003 | Ho et al. | |
| 6,674,512 B2 | 1/2004 | Novak et al. | |
| 6,707,534 B2 | 3/2004 | Bjorklund et al. | |
| 6,710,854 B2 | 3/2004 | Shiraishi et al. | |
| 6,784,975 B2 | 8/2004 | Boettiger et al. | |
| 6,794,100 B2 | 9/2004 | Boettiger et al. | |
| 6,816,302 B2 | 11/2004 | Sandstrom et al. | |
| 6,844,972 B2 | 1/2005 | McGuire, Jr. | |
| 6,894,765 B2 | 5/2005 | Mackey et al. | |
| 6,897,943 B2 | 5/2005 | Schroeder et al. | |
| 6,900,827 B2 | 5/2005 | Taniguchi | |
| 7,038,762 B2 | 5/2006 | Boettiger et al. | |
| 7,046,340 B2 | 5/2006 | Boettiger et al. | |
| 7,053,987 B2 | 5/2006 | Mackey et al. | |
| 7,130,022 B2 | 10/2006 | Mackey et al. | |
| 2002/0058188 A1 | 5/2002 | Iwasaki et al. | |
| 2003/0134207 A1 | 7/2003 | Shiah et al. | |
| 2005/0019673 A1 | 1/2005 | Taravade et al. | |
| 2006/0110684 A1 * | 5/2006 | Kim | 430/311 |
| 2006/0183033 A1 | 8/2006 | Misaka | |

FOREIGN PATENT DOCUMENTS

| | | |
|---|---|---|
| JP | 11231234 | 8/1999 |
| WO | WO-0079345 | 12/2000 |

OTHER PUBLICATIONS

Boulder Nonlinear Systems, "512×512 Multi-level/Analog Liquid Crystal Spatial Light Modulator," 2 pages, <http://www.bnonlinear.com/papers/512SLM.pdf>.

Boulder Nonlinear Systems, "Liquid Crystal Rotors—Ferroelectric and Nematic," 2 pages, <http://www.bnonlinear.corn/papers/rotors.pdf>.

Boulder Nonlinear Systems, "Liquid Crystal Shutters / Variable Optical Attenuaters—Ferroelectric and Nematic," 2 pages, <http://www.bnonlinear.com/papers/shutters.pdf>.

CRL Opto Limited, LCS2-G Datasheet, 4 pages, 2002, <http://www.crlopto.com/products/datasheets/files/LCS2-datasheet.pdf>.

Digital Optics Corporation, "Pattern Generators," 1 page, 2002, retrieved from the Internet on Jul. 30, 2003, <http://www.digitaloptics.com/products_ind.asp?pid=55>.

Farsari, M. et al., "Microfabrication by use of a spatial light modulator in the ultraviolet: experimental results," Optics Letters, vol. 24, No. 8, pp. 549-550, Apr. 15, 1999, Optical Society Of American, Washington, DC.

Fukuda, H. et al., "Improvement of defocus tolerance in a half-micron optical lithography by the focus latitude enhancement exposure method: Simulation and experiment," J. Vac. Sci. Technol. B., vol. 7 No. 4, Jul./Aug. 1989, pp. 667-674.

Hamamatsu Photonics K.K., "PPM—Programmable Phase Modulator," 4 pages, Sep. 2000, <http://www.hamamatsu.com>.

Micro-Optics, Inc., "Polarization Maintaining Faraday Rotator (PMFR)," 1 page, retrieved from the Internet on Jul. 30, 2003, <http://www.microopticsinc.com/PMFR.html>.

Optics.org, "Micronic and Fraunhofer Develop New Pattern Generators," 1 page, Dec. 10, 1999, <http://www.optics.org>.

Texas Instruments Incorporated, "What the Industry Experts Say About Texas Instruments Digital MicroMirror Display (DMD) Technology," 2 pages, Jun. 1994.

International Search Report and Written Opinion for International Application No. PCT/US2008/072236, Nov. 12, 2008.

* cited by examiner

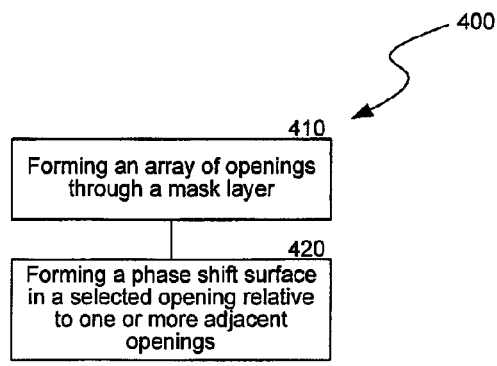
FIG. 4
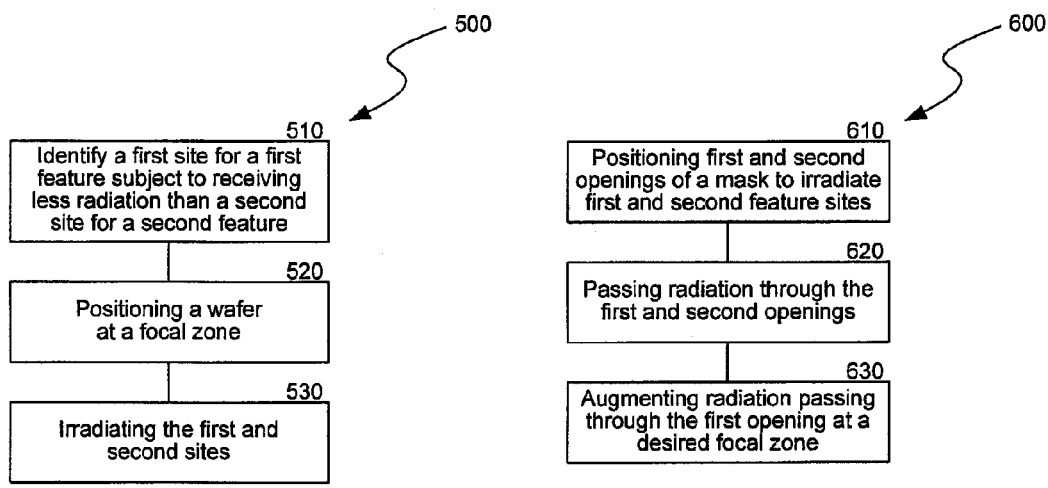
FIG. 5   FIG. 6

MASKS FOR MICROLITHOGRAPHY AND METHODS OF MAKING AND USING SUCH MASKS

TECHNICAL FIELD

The present disclosure is related to masks for use in microlithography tools, and methods of making and using such masks.

BACKGROUND

Microelectronic features are typically formed in and/or on semiconductor wafers or other microfeature workpieces by selectively removing material from the wafer and depositing insulative, semiconductive and/or conductive materials onto the wafer. Microlithography is widely used in semiconductor processing to pattern small features onto the wafer. A typical microlithography process includes depositing a layer of radiation-sensitive material on the wafer (e.g., photoresist), positioning a patterned mask or mask over the photoresist layer, and then irradiating selected regions of the masked photoresist layer with a selected radiation. The wafer is then exposed to a developer, such as an aqueous base or a solvent, that removes either the irradiated regions or the non-irradiated regions of the photoresist layer. In one case, the photoresist layer is initially generally soluble in the developer, and the portions of the photoresist layer exposed to the radiation through patterned openings in the mask change from being generally soluble to being generally resistant to the developer (e.g., so as to have low solubility). Alternatively, the photoresist layer can be initially generally insoluble in the developer, and the portions of the photoresist layer exposed to the radiation through the openings in the mask become more soluble. In either case, the portions of the photoresist layer that are resistant to the developer remain on the wafer, and the rest of the photoresist layer is removed by the developer to form a pattern of openings in the photoresist layer.

After forming the openings in the photoresist layer, the wafer often undergoes several etching or deposition processes. In an etching process, the etchant removes material by the openings in the photoresist layer, but not material protected beneath the remaining portions of the photoresist layer. Accordingly, the etchant creates a pattern of features (such as grooves, channels, or holes) in the wafer material or in materials deposited on the wafer. These features can be filled with insulative, conductive, or semiconductive materials in subsequent deposition processes to build layers of microelectronic features on the wafer. In other deposition processes, metals or other materials can be plated into the openings of the photoresist layer using electroless or electrolytic techniques. The wafer is subsequently singulated after such processing to form individual chips, which can be incorporated into a wide variety of electronic products, such as computers and other consumer or industrial electronic devices.

Microlithography can be a limiting factor in circuit design because it is challenging to pattern progressively smaller circuit features while still maintaining cost-effective manufacturing. For example, certain sites for contacts in high density contact arrays may have a reduced depth of focus such that they do not have the same contrast level as adjacent contacts. This limits the spacing between the contacts such that there is a minimum pitch for dense contact patterns, which in turn limits the ability to decrease the die sizes and/or the cost of manufacturing semiconductor products.

BRIEF DESCRIPTION OF THE DRAWINGS

FIG. 4 is a flow chart illustrating a method of making a mask in accordance with an embodiment of the invention.

FIG. 5 is a flow chart of a method for exposing a photosensitive material to form an array of microfeatures on a semiconductor wafer in accordance with an embodiment of the invention.

FIG. 6 is a flow chart of a method for exposing a photosensitive material to form an array of microfeatures on a semiconductor wafer in accordance with an embodiment of the invention.

DETAILED DESCRIPTION

The following disclosure describes several specific embodiments of masks for microlithography apparatus, methods for making such masks, and methods for exposing photosensitive materials to form arrays of microfeatures on semiconductor wafers using such masks. Although the microfeatures are described below with reference to contacts, the microfeatures can be trenches, doped regions, or other features that are manufactured on or in semiconductor wafers. Additionally, even though the processes are described with reference to processing semiconductor wafers, the processes can be used on other substrates upon which and/or in which microelectronic devices, micromechanical devices, data storage elements, optics, read/write components, and other features are fabricated. For example, SRAM, DRAM (e.g., DDR/SDRAM), flash memory (e.g., NAND flash memory), processors, imagers, and other types of devices can be constructed on semiconductor wafers or other substrates. Moreover, several other embodiments of the invention can have different configurations, components, or procedures than those described in this section. A person of ordinary skill in the art, therefore, will accordingly understand that the invention may have other embodiments with additional elements, or the invention may have other embodiments without several other features shown and described below with reference to FIGS. 1-6.

Figure 1:
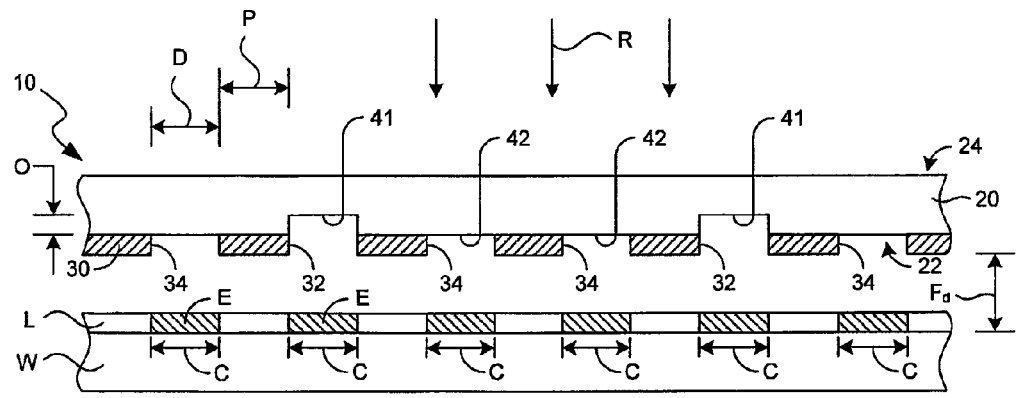
FIG. 1 is a schematic cross-sectional view of a portion of a mask for use in a microlithography apparatus in accordance with an embodiment of the invention.

FIG. 1 is a schematic cross-sectional view of a portion of a mask 10 in accordance with an embodiment of the invention. The mask 10 is generally a component of a reticle used in scanners, steppers, or other types of microlithography tools that pattern very small features onto wafers. It will be appreciated that the features of the mask are not drawn to scale in FIGS. 1-3.

In the embodiment shown in FIG. 1, the mask 10 includes a substrate 20 having a front side 22 configured to face toward a wafer and a back side 24 configured to face a radiation source or transmitter. The substrate 20 can be quartz or another material transmissive to a radiation R directed toward the back side 24 of the substrate 20. The mask 10 further includes a mask layer 30 at the front side 22 of the substrate 20. The mask layer 30 can be chrome or another material that is opaque, non-transmissive or semi-transmissive to the radiation R. The mask layer 30 has a plurality of openings including at least one first opening 32 and at least one second opening 34. The openings 32 and 34 are arranged in a desired configuration of microfeatures that are to be patterned on a workpiece W. The mask layer 30, for example, can have a plurality of first and second openings 32 and 34 arranged to form an array of contacts at contact sites C at the workpiece W. As such, the openings 32 and 34 are configured to have a dimension D and a pitch P between openings such that radiation passing through the openings 32 and 34 irradiates exposed regions E in a photoimageable layer L corresponding to the contact sites C.

The radiation intensity at contact sites may vary at locations across an array using conventional masks such that the radiation intensity at certain contact sites is not sufficient. The contrast at the borders of the exposed regions of the photoresist layer corresponding to such low-radiation contact sites is less than at other exposed regions, and this can adversely affect the uniformity of the size and shape of the resulting contacts. The present inventors believe that the first order diffractions from certain openings in the mask layer 30 destructively interfere with other openings such that only selected openings have a lower radiation intensity.

To resolve this problem, the mask 10 is configured such that radiation passing through the second openings 34 constructively interferes with radiation passing through an adjacent first opening 32 that would otherwise be subject to destructive interference from the radiation passing though the second openings 34. As a result, the radiation intensity at contact sites C associated with first openings 32 is augmented by the radiation associated with one or more adjacent second openings 34 instead of being diminished by the radiation from the neighboring second openings 34. More specifically, in the particular embodiment illustrated in FIG. 1, the mask 10 has first surfaces 41 at corresponding first openings 32 and second surfaces 42 at corresponding second openings 34 that are configured so that radiation exiting the second surfaces 42 constructively interferes with radiation exiting adjacent first surfaces 41 at the workpiece W. In the embodiment shown in FIG. 1, the first surfaces 41 are recessed into the substrate 20 at a location between the front side 22 and the back side 24, and the second surfaces 42 are proximate to the front side 22. The first surfaces 41 are accordingly offset relative to the second surfaces 42 by an offset O, which is selected to create a phase shift between the radiation passing through the first openings 32 and the radiation passing through the second openings 34. The offset O, for example, can be selected such that first order diffractions of the radiation passing through the second openings 34 constructively interfere with the radiation passing through the adjacent first openings 32. In a specific embodiment, the offset O is such that the phase of the radiation exiting the first surfaces 41 is shifted 180° from the phase of the radiation exiting the second surfaces 42. When the phase of the radiation passing through the first openings 32 is shifted 180° from the phase of the radiation passing through the second openings 34, the offset O can be determined according to the following equation:

$$O = \frac{\lambda}{2(n-1)}$$

where λ is the optical wavelength for the radiation and n is the refractive index of the substrate 20.

In operation, the mask 10 is positioned relative to the workpiece W so that the first and second openings 32 and 34 are aligned with the corresponding contact sites C. The radiation R passes through the first and second openings 32 and 34 to accurately irradiate the exposed regions E in the photoimageable layer L. For example, the radiation passing through the first openings 32 is augmented by the radiation passing through the second openings 34 within a focal zone at a focal range $F_d$ from the mask 10. As such, when the first openings 32 are selected to be at contact sites that would otherwise have a lower radiation intensity, the mask 10 enhances the radiation intensity at such contact sites associated with corresponding first openings 32. This in turn enhances the contrast of the exposed regions E associated with corresponding first openings 32. As a result, the first and second openings 32 and 34 can be spaced closer to each other compared to conventional masks to enable accurate patterning of high density arrays of microfeatures.

Figure 2:
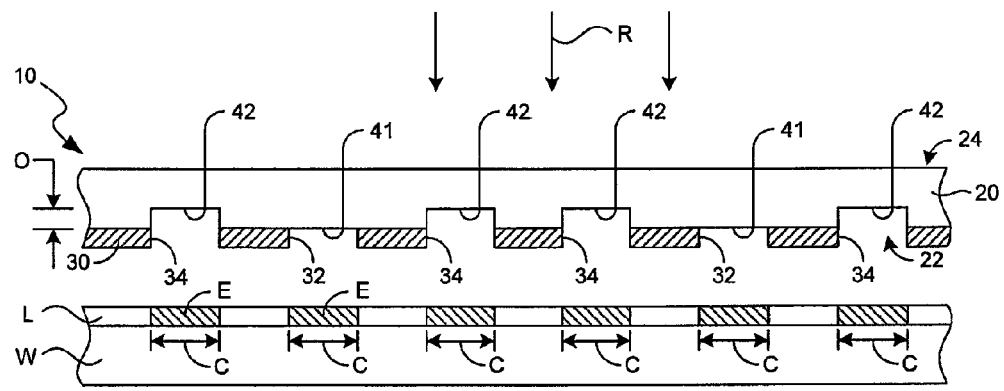
FIG. 2 is a schematic cross-sectional view of a portion of a mask for use in a microlithography apparatus in accordance with another embodiment of the invention.

FIG. 2 illustrates another embodiment of the mask 10 in which the first openings 32 still correspond to contact sites subject to a lower radiation intensity relative to the contact sites associated with the second openings 34. In this embodiment, the second surfaces 42 are recessed into the substrate 20 at a location between the front side 22 and the back side 24, and the first surfaces 41 are at least proximate to the front side 22. The second surfaces 42 can be recessed into the substrate 20 by the same offset O as explained above with respect to FIG. 1. The embodiment of the mask 10 illustrated in FIG. 2 accordingly operates such that the first order diffractions of radiation passing through the second openings 34 constructively interfere with the radiation passing through the first openings 32 to increase the radiation intensity at the contact sites C aligned or otherwise associated with the first openings 32.

The embodiments of the mask 10 shown in FIGS. 1 and 2 can be constructed by forming the mask layer 30 on the substrate 20 such that the mask layer has at least one first opening 32 and a plurality of second openings 34 arranged in an array corresponding to a desired pattern of features to be formed in a die of the workpiece W. The first opening 32 is selected to be at a contact site where the radiation intensity in the focal zone would otherwise be less than that at adjacent contact sites without having the appropriate offset between the first and second surfaces 41 and 42. Several embodiments of the method accordingly include identifying the location(s) of the feature site(s) where the radiation intensity is less than that at adjacent sites or other sites without an offset between surfaces in the openings. The first opening(s) can be identified by, for example, etching all of the openings in the mask layer 30, passing radiation through the openings before forming recesses at the front side 22 of the substrate 20, and measuring radiation intensities at feature sites in the focal zone. Each first opening can be selected to correspond to a site having a lower measured radiation intensity than adjacent sites. In another embodiment, the first opening can be identified by modeling radiation intensities at sites in the focal zone and selecting a site having a lower radiation intensity than adjacent feature sites. After identifying the first openings 32 among the openings in the mask layer 30, the first and second surfaces 41 and 42 are offset relative to each other such that radiation passing through the second openings 34 constructively interferes with radiation passing through an adjacent first opening 32. In the embodiment of the mask 10 shown in FIG. 1, for example, the first surface 41 is formed by etching the substrate 20 through the first openings 32 as known in the art. The embodiment illustrated in FIG. 2 can be formed by etching the second surfaces 42 into the substrate 20.

Figure 3:
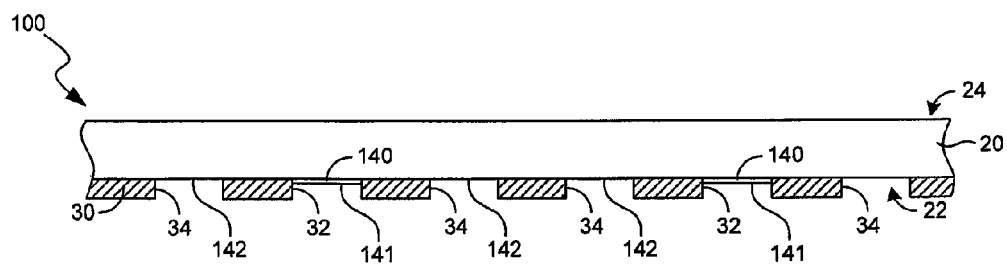
FIG. 3 is a schematic cross-sectional view of a portion of a mask for use in a microlithography apparatus in accordance with yet another embodiment of the invention.

FIG. 3 illustrates a mask 100 in accordance with another embodiment of the invention. The mask 100 shown in FIG. 3 has several features in common with the mask 10, and thus like references numbers refer to like components in FIGS.

1-3. The mask 100, however, has a phase shift element 140 in selected openings to selectively shift the phase of the radiation passing through the openings relative to other openings. In the specific embodiment shown in FIG. 3, the mask 100 has phase shift elements 140 in the first openings 32. The phase shift elements 140 define first surfaces 141 in corresponding first openings 32, and the front side 22 of the substrate 20 defines second surfaces 142 in corresponding second openings 34. The phase shift elements 140 are composed of a material that shifts the phase of the radiation passing through the first openings 32 relative to the radiation passing through the second openings 34 based on the different properties of the materials used for the substrate 20 and the phase shift elements 140. In an alternative embodiment, the phase shift elements 140 can define the second surfaces 142 in the second openings 34 to shift the phase of the radiation passing through the second openings 34 relative to the radiation passing through the first openings 32. In still another embodiment, first phase shift elements can be in the first openings 32 and second phase shift elements with properties different than the first phase shift elements can be in the second openings.

FIG. 4 is a flow chart illustrating a method 400 of making a mask for use in microlithography tools to fabricate semiconductor devices in accordance with another embodiment. The method 400 includes forming an array of openings through a mask layer on a substrate (block 410). The array of openings can correspond to a pattern of features of a die on a semiconductor wafer, and the openings include at least one first opening and a plurality of second openings. The method 400 further includes forming a surface in one of the first or second openings (block 420). The surface is configured such that radiation passing through the first opening is out of phase relative to the radiation passing through the second opening.

FIG. 5 is a flow chart of a method 500 of exposing photosensitive material to form an array of microfeatures on a semiconductor wafer. The method 500 includes identifying a first site for a first feature and a second site for a second feature in an array of features of a die on the wafer (block 510). The first site is subject to receiving less radiation or otherwise having a lower radiation intensity than the second site. The method 500 further includes positioning a wafer at a focal zone for radiation passing through a mask (block 520) and irradiating the first and second sites (block 530). The first and second sites are irradiated such that radiation corresponding to the second site constructively interferes with radiation corresponding to the first site at the focal zone.

FIG. 6 is a flow chart illustrating a method 600 for exposing photosensitive material to form contacts on a semiconductor wafer. The method 600 includes positioning first and second openings of a mask to irradiate first and second sites, respectively, of an array of features of a die on a semiconductor wafer (block 610). The method 600 further includes passing radiation through the first and second openings (block 620). The radiation is passed through the first and second openings such that first order diffractions of radiation passing through the second openings constructively interfere with radiation passing through the first opening at a desired focal zone (block 630).

From the foregoing, it will be appreciated that specific embodiments of the invention have been described herein for purposes of illustration, but well-known structures and function have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

It will further be appreciated that various modifications to the foregoing embodiments may be made without deviating from the inventions. For example, many of the elements of one embodiment can be combined with other elements in addition to, or in lieu of, the elements in the other embodiments. For example, the phase shift elements 140 illustrated in FIG. 3 can be combined with any of the openings of the embodiments illustrated in FIGS. 1 and 2. Accordingly, the invention is not limited except as by the appended claims.

We claim:

1. A method of making a mask for a microlithography apparatus used in semiconductor processing, comprising:
    forming a mask layer on a substrate, wherein the substrate is transmissive to a radiation and the mask layer has a plurality of openings arranged in an array corresponding to a desired pattern of features to be formed in a die of a semiconductor wafer;
    identifying a first opening in the mask layer corresponding to a first feature site at which an intensity of the radiation at a focal zone is less than the intensity of the radiation at the focal zone for a second feature site corresponding to a second opening in the mask proximate to the first opening; and
    based on the identification, forming a first surface at the identified first opening and a second surface at the second opening such that radiation passing through the second opening constructively interferes with radiation passing through the first opening at the focal zone.

2. The method of claim 1 wherein the mask layer is formed before identifying the first opening in the mask, and identifying the first opening comprises:
    passing radiation through the openings of the mask before forming the first and second surfaces of the first and second openings, respectively; and
    measuring radiation intensities at sites in the focal zone, wherein the first opening corresponds to a site having a lower measured radiation intensity.

3. The method of claim 1 wherein identifying the first opening comprises modeling radiation intensities at feature sites in the focal zone and selecting a site having a lower radiation intensity than other sites.

4. The method of claim 1 wherein forming the first and second surfaces comprises etching the substrate such that the first surface is offset from the second surface by a distance.

5. The method of claim 1 wherein forming the first and second surfaces comprises etching the mask layer to expose the substrate at the first and second openings, and further etching the substrate at the first opening to form the first surface such that the first surface is recessed into the substrate relative to the second surface.

6. The method of claim 5 wherein the first surface is etched to a depth that shifts the phase of the radiation passing through the first opening by approximately 180° from the phase of the radiation passing through the second opening.

7. The method of claim 1 wherein forming the first and second surfaces comprises positioning a phase shift element on the substrate in at least one of the first and second openings.

8. A method of making a mask for a microlithography apparatus used in semiconductor processing, comprising:

forming an array of openings through a mask layer on a substrate corresponding to a pattern of features of a die of a semiconductor wafer, wherein the openings include a first opening and a second opening exposing a first portion and a second portion of a surface of the substrate, respectively;

identifying a first intensity of radiation and a second intensity of radiation at a focal zone, the first intensity having a lower value than the second intensity, the first intensity generally corresponding to the first opening, and the second intensity generally corresponding to the second opening; and thereafter, based on the identification, forming a surface in one of the first or second openings by recessing one of the first portion and second portion of the surface of the substrate such that radiation passing through the first opening is augmented at the focal zone by radiation passing through the second opening.

9. The method of claim 8 wherein forming the surface comprises forming a first surface at the first opening and a second surface at the second opening by etching the substrate such that the first surface is offset from the second surface by a distance.

10. The method of claim 9 wherein forming the first and second surfaces comprises etching the mask layer to expose the substrate at the first and second openings, and further etching the substrate at the first opening to form the first surface such that the first surface is recessed into the substrate relative to the second surface.

11. The method of claim 9 wherein forming the first and second surfaces comprises etching the mask layer to expose the substrate at the first and second opening, and further etching the substrate at the second opening such that the second surface is recessed relative to the first surface.

12. The method of claim 8 wherein forming the surface comprises positioning a phase shift element in one of the first opening or the second opening.

13. A method of making a photolithography mask, comprising:

forming an array of openings through a mask layer on a generally planar surface of a substrate, the openings corresponding to a pattern of features of a semiconductor die, wherein the openings individually expose a portion of the surface of the substrate;

radiating the semiconductor die through the substrate and the formed array of openings in the mask layer to produce the pattern of features;

from the plurality of openings, identifying a first opening that corresponds to a produced feature with a radiation intensity less than that of an adjacent second opening; and based on the identification, modifying the exposed portion of the surface of the substrate corresponding to the identified first or second opening such that radiation passing through the first opening is augmented at the focal zone by radiation passing through the second opening.

14. The method of claim 13 wherein:

forming an array of openings includes:

depositing a mask layer on a first surface of a substrate, the substrate having a second surface opposite the first surface;

forming a plurality of openings in the mask layer, the openings individually exposing a portion of the first surface of the substrate;

the semiconductor die has a photoresist facing the first surface of the substrate;

radiating the semiconductor die includes:

passing radiation from the second surface of the substrate through the first surface of the substrate and the openings to the portions of the photoresist on the semiconductor die;

identifying the first opening includes identifying a first feature site exposed less than a second feature site, the first and second feature sites corresponding to first and second openings, respectively; and modifying the exposed portion of the surface includes recessing the portion of the surface of the substrate corresponding to the first opening into the substrate by a distance (O) defined as $$O = \frac{\lambda}{2(n-1)}$$

via etching, where $\lambda$ is an optical wavelength for the radiation, and n is a refractive index of the substrate.

15. The method of claim 13 wherein modifying the exposed portion includes recessing the portion of the surface of the substrate corresponding to the first or second opening into the substrate.

16. The method of claim 13 wherein modifying the exposed portion includes recessing the portion of the surface of the substrate corresponding to the first or second opening into the substrate by a distance (O) defined as $$O = \frac{\lambda}{2(n-1)},$$

where $\lambda$ is an optical wavelength for the radiation, and n is a refractive index of the substrate.

17. The method of claim 13 wherein modifying the exposed portion includes recessing the portion of the surface of the substrate corresponding to the first or second opening into the substrate by a distance (O) defined as $$O = \frac{\lambda}{2(n-1)}$$

via etching, where $\lambda$ is an optical wavelength for the radiation, and n is a refractive index of the substrate.

18. The method of claim 13 wherein modifying the exposed portion includes recessing the portion of the surface of the substrate corresponding to the first opening into the substrate by a distance (O) defined as $$O = \frac{\lambda}{2(n-1)}$$

via etching, where $\lambda$ is an optical wavelength for the radiation, and n is a refractive index of the substrate.

19. The method of claim 13 wherein modifying the exposed portion includes positioning a phase shift element in one of the first or second openings.

* * * * *